(12) United States Patent
Otsuka (10) Patent No.: US 9,379,684 B2
(45) Date of Patent: Jun. 28, 2016

(54) RECORDER

(71) Applicant: Panasonic Intellectual Property Management Co., Ltd., Osaka (JP)

(72) Inventor: Yoshio Otsuka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 64 days.

(21) Appl. No.: 14/571,337

(22) Filed: Dec. 16, 2014

(65) Prior Publication Data

US 2015/0194931 A1 Jul. 9, 2015

(30) Foreign Application Priority Data

Jan. 6, 2014 (JP) ................................. 2014-000056

(51) Int. Cl.
| | |
|---|---|
| H03G 3/20 | (2006.01) |
| H03F 99/00 | (2009.01) |
| H03G 3/30 | (2006.01) |
| H03F 3/181 | (2006.01) |

(52) U.S. Cl.
CPC ............. *H03G 3/3005* (2013.01); *H03F 3/181* (2013.01)

(58) Field of Classification Search
None
See application file for complete search history.

(56) References Cited

U.S. PATENT DOCUMENTS

| | | | | | |
|---|---|---|---|---|---|
| 2006/0170662 | A1* | 8/2006 | Kurane | .................. | H04N 5/235 348/E5.034 |
| 2008/0219470 | A1* | 9/2008 | Kimijima | ................. | H04S 1/002 381/92 |
| 2010/0017203 | A1* | 1/2010 | Archibald | ............ | H03G 3/3005 704/208 |
| 2010/0061569 | A1* | 3/2010 | Kamatori | ................. | H04R 5/02 381/119 |
| 2010/0195846 | A1* | 8/2010 | Yokoyama | ............. | H03G 7/007 381/102 |
| 2011/0022403 | A1* | 1/2011 | Washisu | .................... | H04N 5/60 704/503 |
| 2012/0148063 | A1* | 6/2012 | Kajimura | ............ | G10L 21/0208 381/73.1 |
| 2012/0207315 | A1* | 8/2012 | Kimura | .................. | H04R 3/005 381/66 |
| 2013/0311174 | A1* | 11/2013 | Yoshimatsu | ............. | H03G 3/32 704/225 |
| 2014/0185833 | A1* | 7/2014 | Ikeda | ..................... | H03G 3/301 381/107 |

FOREIGN PATENT DOCUMENTS

JP 2010-157966 7/2010

* cited by examiner

*Primary Examiner* — Thang Tran
(74) *Attorney, Agent, or Firm* — Wenderoth, Lind & Ponack, L.L.P.

(57) ABSTRACT

The recorder includes: a converter acquiring external sound and converting the sound into a first signal; an amplifier amplifying the first signal to generate a second signal; a recording unit recording the second signal; a display unit displaying a level of the second signal; and a controller controlling the amplifier and the display unit. The amplifier includes an ALC (automatic level control) unit adjusting an amplification degree for amplifying the first signal according to the level of the second signal. The controller allows a choice of whether or not to cause the ALC unit to operate, allows a choice of whether to display or hide the level of the second signal on the display unit when the automatic level control unit operates, and keeps the level of the second signal displayed on the display unit when the automatic level control unit does not operate.

5 Claims, 8 Drawing Sheets

| ALC function | "enable" | "disable" |
|---|---|---|
| Display of microphone level meter | "visible" / "hidden" | "visible" |

RECORDER

BACKGROUND

1. Technical Field

The present disclosure relates to a recorder that has an automatic level control function.

2. Description of the Related Art

Recorders that have an automatic level control function have been known. The recorders include camcorders and digital cameras that can record moving images. For example, PTL 1 discloses a recorder which displays an operation state of a level adjustment means that uses an automatic level controller in processing an audio signal.

CITATION LIST

Patent Literature

PTL 1: Unexamined Japanese Patent Publication No. 2010-157966

SUMMARY

The recorder according to the present disclosure allows a choice of whether to turn on or off an ALC (automatic level control) function and allows monitoring of whether audio is distorted or not even in the case where the ALC function is turned off.

The recorder according to the present disclosure includes: a converter configured to acquire external sound and to convert the sound into a first signal; an amplifier configured to amplify the first signal to generate a second signal; a recording unit configured to record the second signal; a display unit configured to display a level of the second signal; and a controller configured to control the amplifier and the display unit. The amplifier includes an ALC (automatic level control) unit configured to adjust an amplification degree for amplifying the first signal according to the level of the second signal. The controller allows a choice of whether or not to cause the ALC unit to operate, allows a choice of whether to display or hide the level of the second signal on the display unit, and, on the other hand when the ALC unit operates, and keeps the level of the second signal displayed on the display unit when the ALC unit does not operate.

With the above described configuration, the recorder according to the present disclosure allows a choice of whether to turn on or off the ALC function and causes a recording level to be automatically displayed in the case where the ALC function is turned off. Therefore, the recorder according to the present disclosure allows monitoring of whether the audio is distorted or not even in the case where the ALC function is turned off.

DETAILED DESCRIPTION OF THE PREFERRED EMBODIMENTS

Exemplary embodiments will be described in detail below with reference to the drawings as required. However, an excessively detailed description may be omitted. For example, a detailed description of an already well-known matter and repetitive descriptions of substantially the same configuration may be omitted. All of such omissions are intended to facilitate understanding by those skilled in the art by preventing the description below from becoming unnecessarily redundant.

The inventor provides the accompanying drawings and the description below for those skilled in the art to fully understand the present disclosure and does not intend to limit the subject matter described in the claims to the accompanying drawings and the description below.

First Exemplary Embodiment

Exemplary embodiments below will be described by using digital camera 100 as an example. Digital camera 100 is an example of the recorder. The configuration and the operation of digital camera 100 will be described below.

1. Configuration

The configuration of digital camera 100 will be described below with reference to the drawings.

[1-1. Configuration of the Digital Camera]

Figure 1:
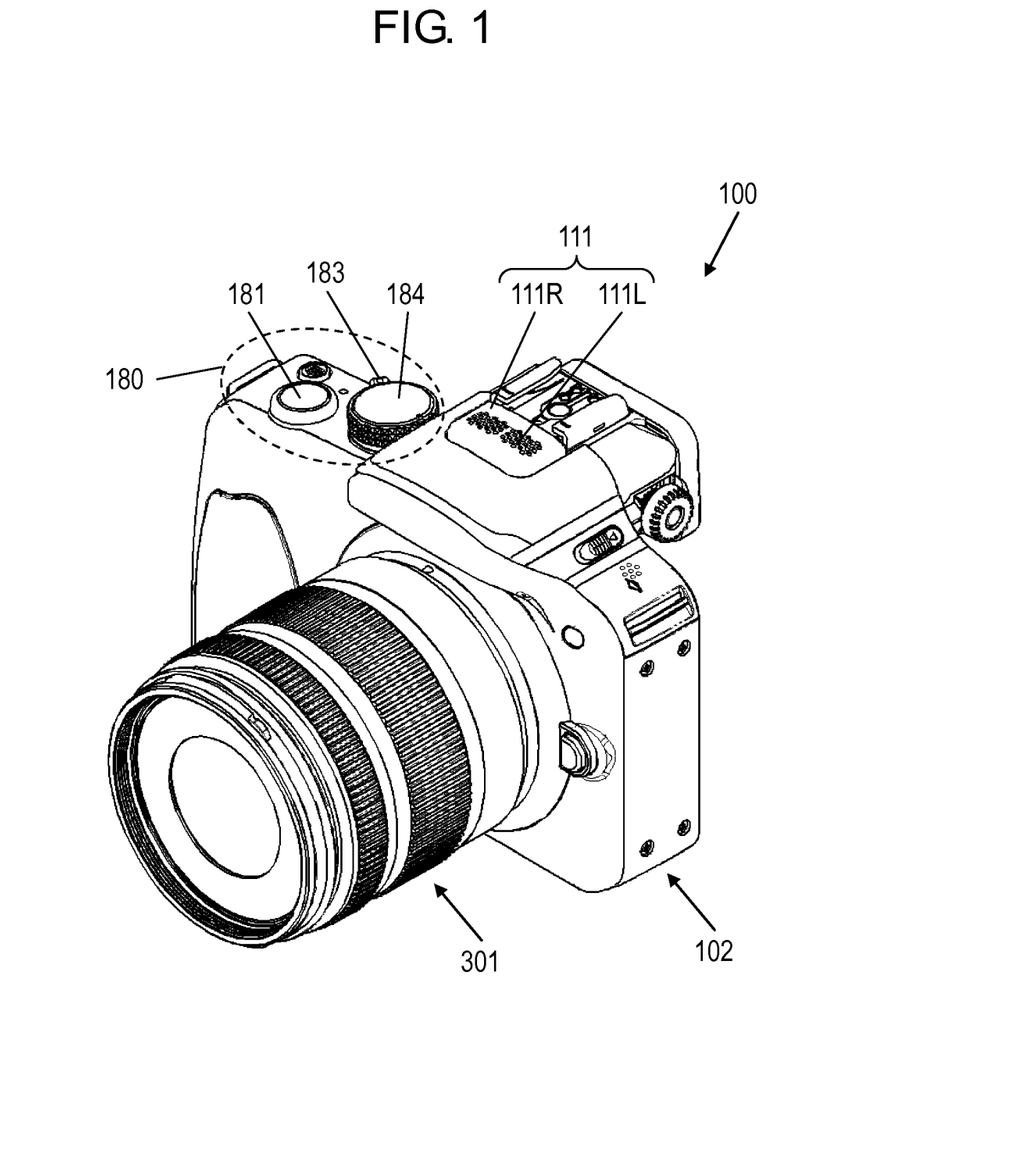
FIG. 1 is a front perspective diagram of a digital camera according to a first exemplary embodiment.

FIG. 1 is a front perspective diagram of digital camera 100. Digital camera 100 has camera body 102 and interchangeable lens 301. Camera body 102 has operation unit 180. Operation unit 180 includes release button 181, power switch 183, and mode dial 184.

In addition, camera body 102 has microphone unit 111. Microphone unit 111 includes two microphones of microphone 111L and microphone 111R. While recording a moving image, digital camera 100 acquires external sound by using microphone unit 111 and records the sound in parallel with the recording of the moving image.

Figure 2:
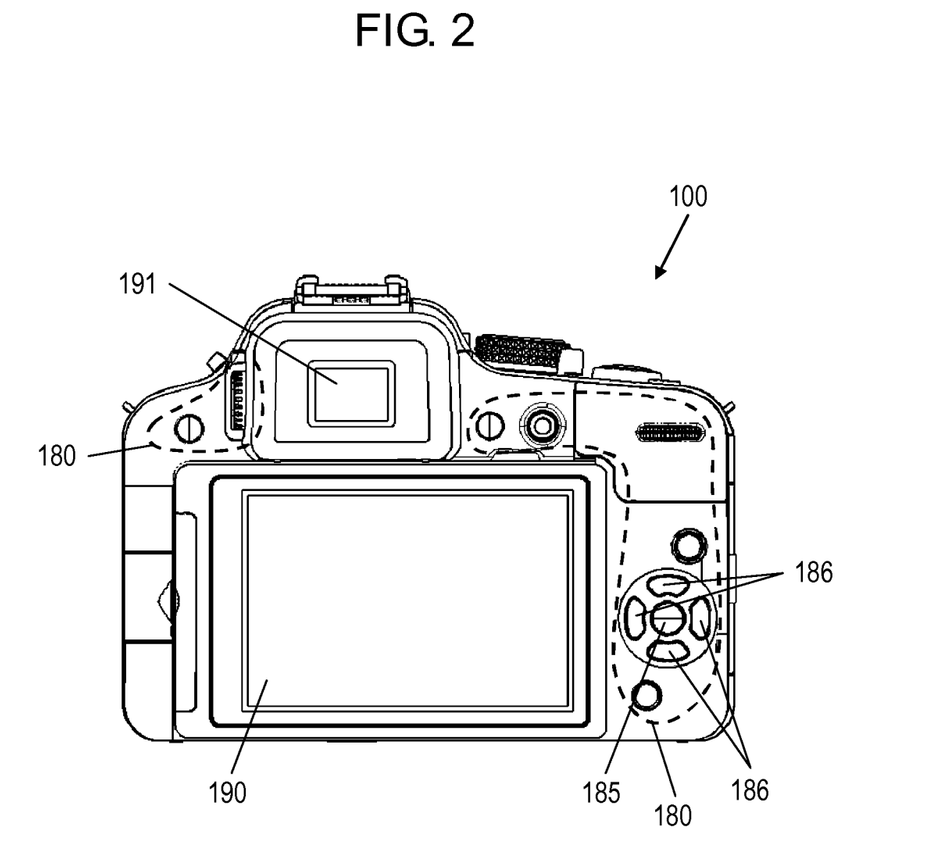
FIG. 2 is a rear diagram of the digital camera according to the first exemplary embodiment.

FIG. 2 is a rear diagram of camera body 102. Camera body 102 has operation unit 180 also on the rear surface. Operation unit 180 includes center button 185 and directional buttons 186. Digital camera 100 has display unit 190 and view finder 191 on the rear surface.

Figure 3:
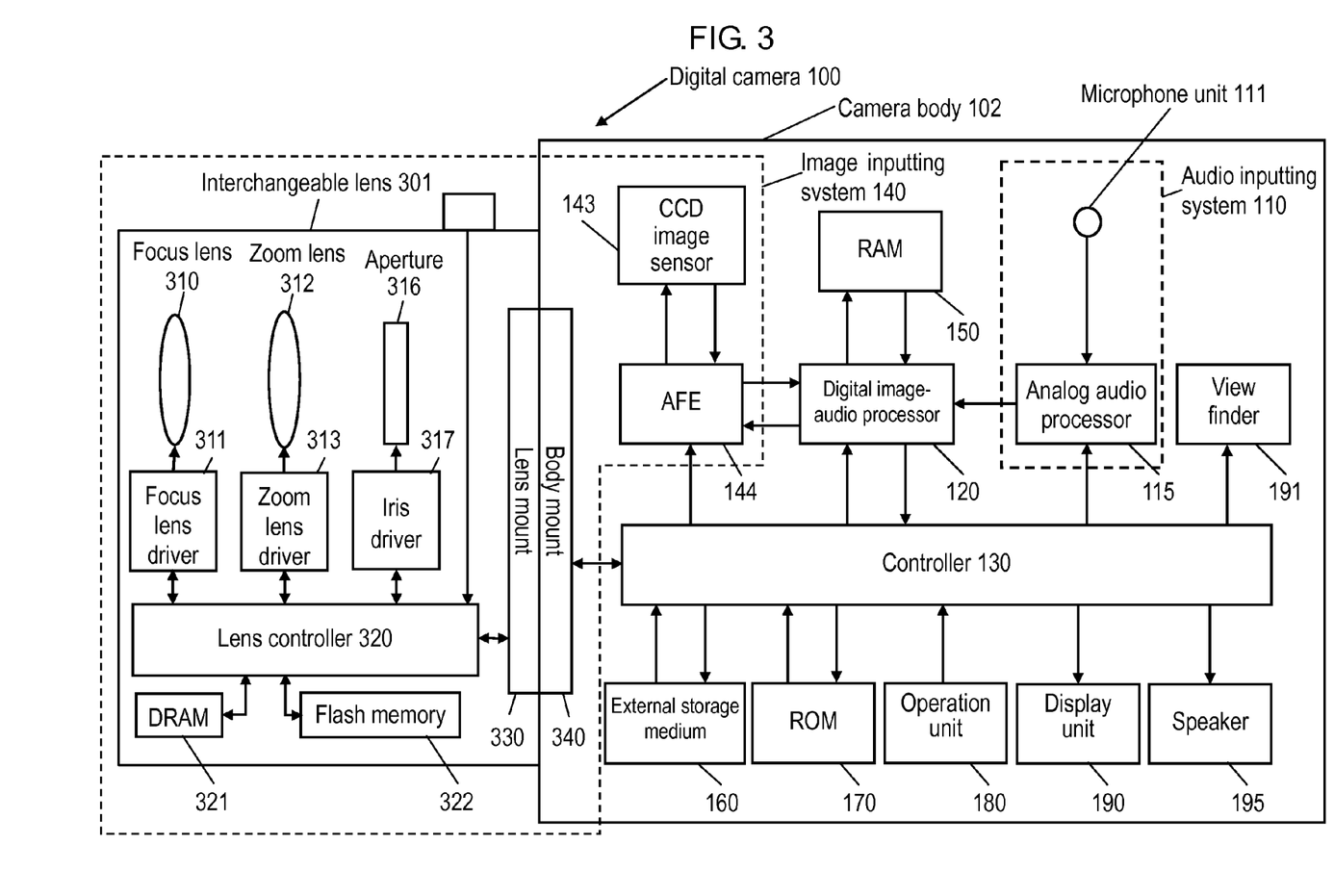
FIG. 3 is a block diagram illustrating an electrical configuration of the digital camera according to the first exemplary embodiment.

An electrical configuration of digital camera 100 will be described with reference to FIG. 3. FIG. 3 is a block diagram illustrating an electrical configuration of digital camera 100.

Digital camera 100 generates image information and an audio signal from information acquired from external sources. The image information is generated by image inputting system 140. The audio signal is generated by audio inputting system 110. The generated image information and audio signal are subjected to A/D (analog/digital) conversion, subjected to various types of processing in digital image-audio processor 120, and then recorded in external storage medium 160 such as a memory card. The image information recorded in external storage medium 160 is displayed on display unit 190 in response to a user operation on operation unit 180. Alternatively, the image information recorded in external storage medium 160 is displayed on view finder 191. The audio signal recorded in external storage medium 160 is output from speaker 195 in response to a user operation on operation unit 180.

Details of the respective components illustrated in FIG. 1 to FIG. 3 will be described below.

[1-1-1. Configuration of the Image Inputting System]

Image inputting system 140 has interchangeable lens 301, CCD image sensor 143, and AFE (analog front end) 144. Interchangeable lens 301 includes an optical system such as focus lens 310, zoom lens 312, aperture 316, and so on. Interchangeable lens 301 has a driver which executes drive control on the optical system. The driver includes focus lens driver 311, zoom lens driver 313, and iris driver 317. Interchangeable lens 301 has lens controller 320 which controls the driver. Lens controller 320 is connected to DRAM 321 and flash memory 322. With this connection, lens controller 320 can read and write information out from and into DRAM 321 and flash memory 322 as required.

A subject image formed through interchangeable lens 301 is made into image information in CCD image sensor 143. The image information obtained from CCD image sensor 143 is subjected to analog-digital conversion and so on in AFE 144. Interchangeable lens 301 is electrically and mechanically connected with camera body 102 via lens mount 330 and body mount 340.

[1-1-2. Configuration of the Camera Body]

Camera body 102 has image inputting system 140, audio inputting system 110, digital image-audio processor 120, controller 130, RAM 150, external storage medium 160, ROM 170, operation unit 180, display unit 190, view finder 191, and speaker 195. Image inputting system 140 has been described above.

Audio inputting system 110 has microphone unit 111 and analog audio processor 115. As illustrated in FIG. 1, microphone unit 111 includes microphones 111L and 111R. Microphone unit 111 converts a sound signal into an electric signal by using each of microphones 111L and 111R and inputs the electric signal into analog audio processor 115.

Analog audio processor 115 amplifies the analog audio signal received from microphone unit 111 and converts the analog audio signal into a digital signal and then outputs the digital signal to digital image-audio processor 120. Details of analog audio processor 115 will be described later.

Digital image-audio processor 120 performs various types of processing on the image information output from AFE 144 and the audio signal output from analog audio processor 115. For example, digital image-audio processor 120 performs various types of processing on the audio signal in accordance with an instruction from controller 130. Digital image-audio processor 120 may be implemented by a hardwired electronic circuit, a microcomputer that executes a program, or the like. Digital image-audio processor 120 may be formed on a semiconductor chip integrally with controller 130 and the like. Digital image-audio processor 120 performs a directivity synthesis process as an acoustic zoom process by performing arithmetic processing on the output from microphone unit 111.

As illustrated in FIG. 2, display unit 190 is disposed on the rear surface of digital camera 100. In the first exemplary embodiment, display unit 190 is a liquid crystal display. Display unit 190 displays an image based on the image information processed in digital image-audio processor 120.

Figure 7A:
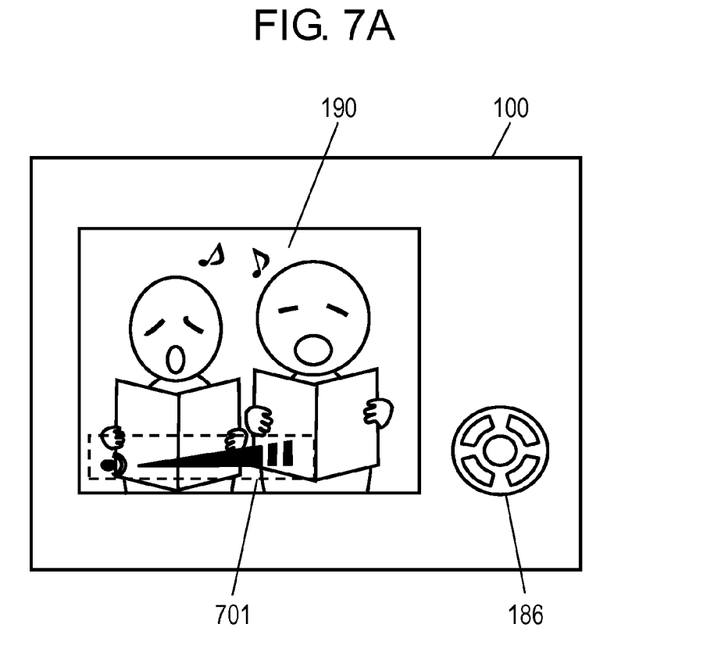
FIG. 7A is a diagram showing an exemplary display on a display unit of the digital camera according to the first exemplary embodiment with the microphone level meter visible.

Controller 130 controls display unit 190 to display or hide various icons that represent a setup of mode dial 184 and the like and microphone level meter 701 that indicates a microphone level, i.e., a level of an audio signal that is to be input to external storage medium 160, as illustrated in FIG. 7A on a through image. The user can confirm a setup state of digital camera 100 by referring to the various icons displayed over the through image. The user can confirm the level of the audio signal to be recorded in external storage medium 160 by referring to microphone level meter 701 displayed over the through image. Speaker 195 outputs the audio signal recorded in external storage medium 160. Content displayed on display unit 190 can be also displayed on view finder 191.

Controller 130 also controls an ALC (automatic level control) function. Specifically, controller 130 enables or disables the ALC function by controlling analog audio processor 115 in response to a user operation. Controller 130 controls overall operation of digital camera 100.

ROM 170 stores a program for controlling the overall operation of digital camera 100. ROM 170 stores respective conditions and set-up items of digital camera 100.

Controller 130 may be implemented by a hardwired electronic circuit, a microcomputer that executes a program, or the like. Alternatively, controller 130 may be formed on a semiconductor chip integrally with digital image-audio processor 120 and the like. ROM 170 does not need to be provided outside controller 130 as a separate component and may be incorporated in controller 130.

RAM 150 functions as a work memory for digital image-audio processor 120 and controller 130. RAM 150 may be implemented by an SDRAM, a flash memory, or the like. RAM 150 also functions as an internal memory for recording the image information, the audio signals, and the like.

External storage medium 160 is an external memory that incorporates a nonvolatile recording unit such as a flash memory. External storage medium 160 can record data to be processed in digital image-audio processor 120 such as the image information and the audio signals.

Operation unit 180 collectively refers to operational interfaces provided on the exterior of digital camera 100, such as operation buttons and operation dials. Operation unit 180 receives a user operation. Operation unit 180 includes, for example, release button 181, power switch 183, mode dial 184, center button 185, and directional buttons 186 illustrated in FIG. 1 and FIG. 2. When operation unit 180 receives a user operation, operation unit 180 sends signals instructing various operations to controller 130.

Release button 181 is a push button that works as a two stroke button to be actuated in response to a half-press operation and actuated in response to a full-press operation. When release button 181 is half-pressed by the user, controller 130 determines image-recording conditions. Subsequently, when release button 181 is full-pressed by the user, controller 130 causes external storage medium 160 or the like to record the image information captured at the moment of the full-press operation.

Power switch 183 is a switch for switching ON/OFF the power supply for the respective components of digital camera 100.

Mode dial 184 is a jog dial. When mode dial 184 is turned by the user, controller 130 causes the operation mode of digital camera 100 to be switched to the operation mode corresponding to the position to which mode dial 184 has just been turned.

Center button 185 is a push button. When center button 185 is pressed by the user while digital camera 100 is in an image-recording mode or a playback mode, controller 130 causes a menu screen to be displayed on display unit 190. The menu screen is a screen for the user to set various image-recording conditions and playback conditions. When the user has selected values of set-up items for respective conditions on the screen menu and presses center button 185, the values are fixed to the set-up items. The fixed set-up items are stored in ROM 170.

Directional buttons 186 includes four push buttons disposed in the upward, downward, leftward, and rightward directions. By pressing any one of directional buttons 186, the user can choose a value from among the values of set-up items for respective conditions displayed on the menu screen. Display unit 190 is provided with a touch panel which detects contact and a contact position. Display unit 190 can substitute for operation unit 180, receive a user operation and send signals instructing various operations to controller 130.

2. Operation

Hereinafter, operation of digital camera 100 according to the first exemplary embodiment will be outlined. When the power supply of the camera body 102 equipped with interchangeable lens 301 is switched on by the user operating power switch 183 of the camera body 102, power is supplied to digital camera 100 and the digital camera 100 is initially set up.

Figure 4:
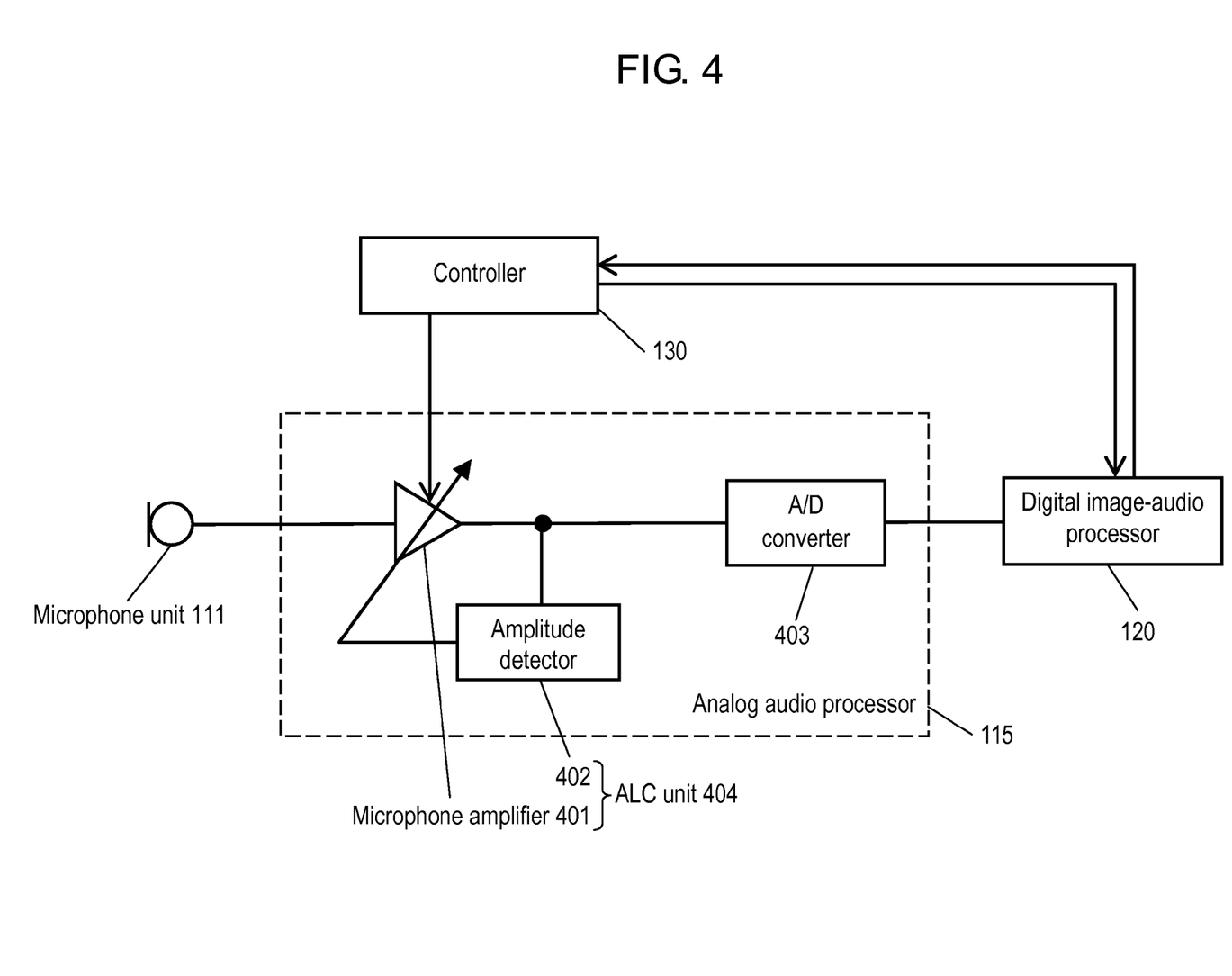
FIG. 4 is a block diagram illustrating a configuration containing an analog audio processor and peripheral components of the analogue audio processor included in the digital camera according to the first exemplary embodiment.

FIG. 4 is a block diagram illustrating a configuration containing analogue audio processor 115 and peripheral components of analogue audio processor 115. Analog audio processor 115 has microphone amplifier 401, amplitude detector 402, and A/D converter 403. Microphone amplifier 401 and amplitude detector 402 form ALC unit 404.

Analog audio processor 115 inputs the analog audio signal received from microphone unit 111 into microphone amplifier 401. Microphone amplifier 401 amplifies the analog audio signal by a given amplification degree. Microphone amplifier 401 inputs the amplified audio signal into A/D converter 403. A/D converter 403 performs A/D conversion on the input audio signal and outputs the converted audio signal to digital image-audio processor 120. In accordance with an instruction from controller 130, analog audio processor 115 amplifies the analog audio signal received from microphone unit 111 by using microphone amplifier 401 by a given amplification degree and inputs the amplified analog audio signal into A/D converter 403. When operation unit 180 receives a user operation and sends a signal indicating the amplification degree of microphone amplifier 401 to controller 130, in accordance with the instruction from controller 130, analog audio processor 115 sets the amplification degree of microphone amplifier 401.

The analog audio signal amplified by microphone amplifier 401 is input to amplitude detector 402. In the case where the ALC function is enabled, controller 130 causes the amplification degree of microphone amplifier 401 to be decreased so that the amplitude of the analog audio signal to be input to A/D converter 403 does not exceed an acceptable input level for A/D converter 403. Specifically, amplitude detector 402 receives the analog audio signal amplified by microphone amplifier 401 and performs feedback control of the amplification degree of microphone amplifier 401 so that the amplitude of the analog audio signal does not exceed the acceptable input level for A/D converter 403. In the case where the ALC function is disabled, amplitude detector 402 receives the analog audio signal amplified by microphone amplifier 401. Amplitude detector 402 does not change the amplification degree of microphone amplifier 401 even if the amplitude of the analog audio signal exceeds the acceptable input level for A/D converter 403.

A/D converter 403 receives the analog audio signal amplified by microphone amplifier 401 and performs A/D conversion on the amplified analog audio signal. A/D converter 403 outputs the A/D converted audio signal to digital image-audio processor 120. In the case where the ALC function is enabled, a loud sound that has been input to microphone unit 111 does not cause the analog audio signal output from microphone amplifier 401 to exceed the acceptable input level for A/D converter 403. As a result, an output waveform of A/D converter 403 has minor distortion. In the case where the ALC function is disabled, a loud sound that has been input to microphone unit 111 may cause the analog audio signal output from microphone amplifier 401 to exceed the acceptable input level for A/D converter 403. As a result, an output waveform of A/D converter 403 may have considerable distortion. However, since the amplification degree is kept unchanged, high linearity is ensured between the audio signal input to microphone unit 111 and the audio signal recorded in external storage medium 160 as far as the amplitude of the analog audio signal is within the acceptable input level for A/D converter 403. In other words, external storage medium 160 is capable of recording highly modulated sound with high fidelity.

Operation performed when the ALC function is enabled will be quantitatively described below by using an example.

It is assumed that a given amplification degree that is previously set in microphone amplifier 401 is +20 dBV. It is also assumed that the acceptable input level for A/D converter 403 is −6 dBV. On the condition that the amplitude of the analog audio signal output from microphone unit 111 is −40 dBV, the output from microphone amplifier 401 is −20 dBV which does not exceed the acceptable input level for A/D converter 403. In the case where the sound has become louder and caused the amplitude of the analog audio signal output from microphone unit 111 to be −25 dBV but the amplification degree of microphone amplifier 401 is still kept at +20 dBV, the output from microphone amplifier 401 becomes −5 dBV. Therefore, the output from microphone amplifier 401 exceeds the acceptable input level for A/D converter 403. Then, ALC unit 404 changes the amplification degree of microphone amplifier 401 to +19 dBV to cause the output from microphone amplifier 401 to be −6 dBV. Therefore, the output from microphone amplifier 401 does not exceed the acceptable input level for A/D converter 403. In the case where the sound has become smaller and caused the amplitude of the analog audio signal output from microphone unit 111 to be −30 dBV, the amplification degree of microphone amplifier 401 is set again to the given amplification degree that is previously set in microphone amplifier 401, i.e., +20 dBV. As a result, the output from microphone amplifier 401 becomes −10 dBV which does not exceed the acceptable input level for A/D converter 403.

Operation performed when the ALC function is disabled will be quantitatively described below by using an example.

It is assumed that a given amplification degree that is previously set in microphone amplifier 401 is +20 dBV. It is also assumed that the acceptable input level for A/D converter 403 is −6 dBV. In the case where the amplitude of the analog audio signal output from microphone unit 111 is −40 dBV, the output from microphone amplifier 401 is −20 dBV which does not exceed the acceptable input level for A/D converter 403. In the case where the sound has become louder and caused the amplitude of the analog audio signal output from microphone unit 111 to be −25 dBV, the output from microphone amplifier 401 becomes −5 dBV, since the amplification degree of microphone amplifier 401 is still kept at +20 dBV. Therefore, the output from microphone amplifier 401 exceeds the acceptable input level for A/D converter 403. In the case where the output from microphone amplifier 401 exceeds the acceptable input level for A/D converter 403, the output from A/D converter 403 has distortion. In the case where the sound has become smaller and caused the amplitude of the analog audio signal output from microphone unit 111 to be −30 dBV, the output from microphone amplifier 401 becomes −10 dBV, since the amplification degree of microphone amplifier 401 is still kept at +20 dBV. Therefore, the output from microphone amplifier 401 does not exceed the acceptable input level for A/D converter 403.

On condition that the volume of the sound to be recorded is previously known when the ALC function is disabled, the user can make the linearity between the audio signal to be input to microphone unit 111 and the audio signal to be recorded in external storage medium 160 kept high while preventing the output from A/D converter 403 from being distorted. For example, in the above described case, the user may find out that the maximum amplitude of the analog audio signal output from microphone unit 111 is −20 dBV by holding a rehearsal. Then, the user only needs to change the amplification degree of microphone amplifier 401 to +14 dBV based on the previously obtained maximum amplitude of the analog audio signal.

If the level of the audio signal to be recorded in external storage medium 160 is not displayed when the ALC function is disabled, the user cannot notice that the audio signal to be recorded is distorted. Further, it is inconvenient for the user to change the display setting of the level of the audio signal to be recorded each time the user disables the ALC function. The recorder according to the present disclosure automatically displays the level of the audio signal to be recorded in the storage medium when the ALC function is disabled. Details of a mechanism for automatically displaying the level of the audio signal to be recorded in the storage medium when the ALC function is disabled will be described below.

Figure 5:
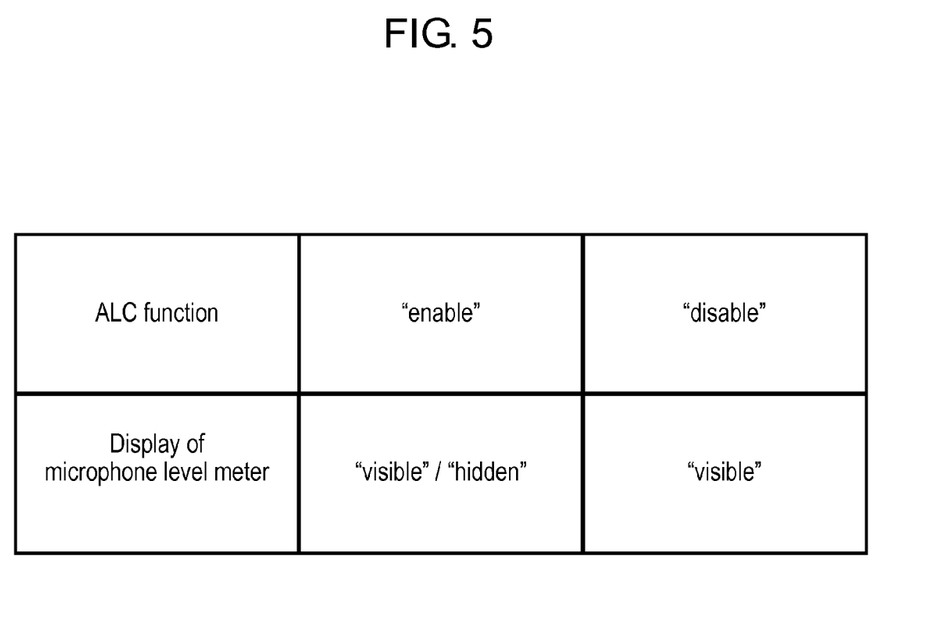
FIG. 5 is a setup table showing an ALC (automatic level control) function and a microphone level meter of the digital camera according to the first exemplary embodiment.

FIG. 5 is a setup table showing the ALC function and microphone level meter 701 of digital camera 100. When the user sets "visible" for microphone level meter 701 illustrated in FIG. 7A on the menu screen, controller 130 causes microphone level meter 701 to be displayed over the through image displayed on display unit 190. When the user sets "hidden" for microphone level meter 701 on the menu screen, controller 130 does not cause microphone level meter 701 to be displayed over the through image displayed on display unit 190. When the user sets "enable" for the ALC function on the menu screen, controller 130 causes microphone level meter 701 to be displayed or hidden over the through image displayed on display unit 190 responding to the setting of microphone level meter 701. When the user sets "disable" for the ALC function on the menu screen, controller 130 causes microphone level meter 701 to be displayed over the through image displayed on display unit 190 independently of the setting of microphone level meter 701.

Figure 6:
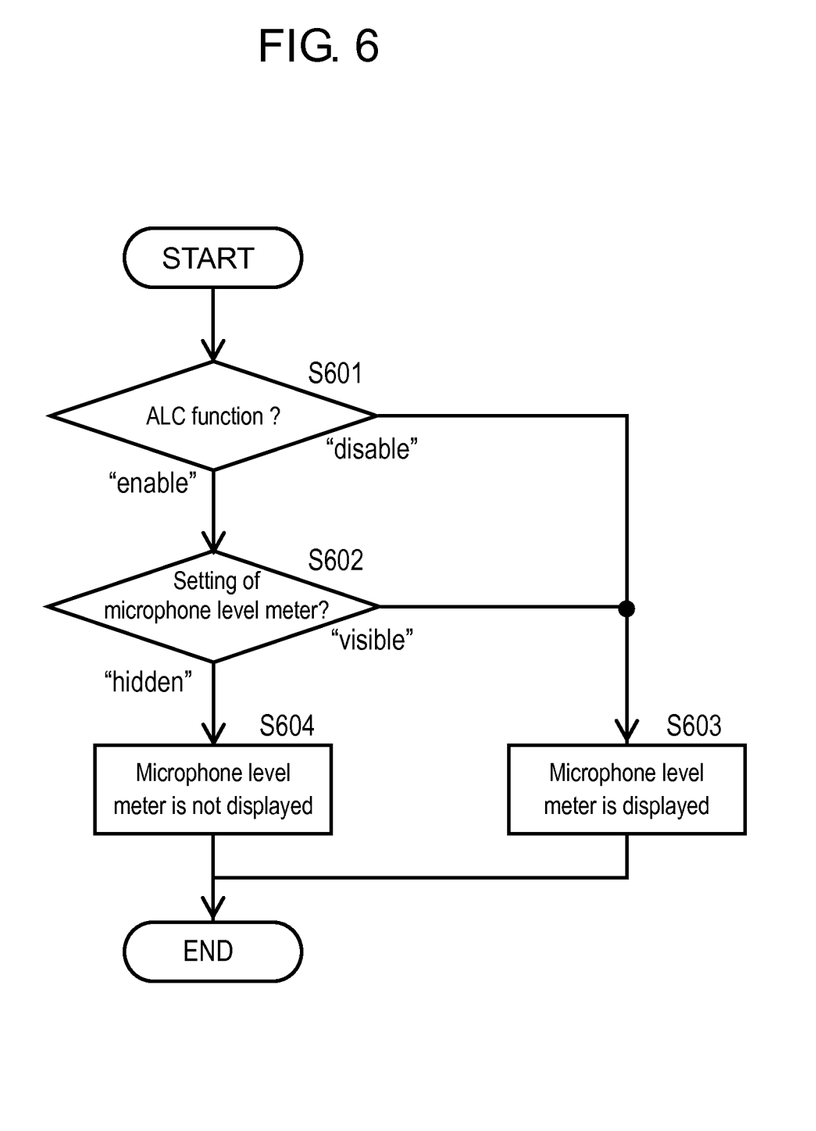
FIG. 6 is a flow chart for setting the microphone level meter in the digital camera according to the first exemplary embodiment.

FIG. 6 is a flow chart for setting microphone level meter 701 of digital camera 100. In step S601, controller 130 checks whether the ALC function is enabled or disabled. In the case where the ALC function is enabled, digital camera 100 proceeds to step S602. In the case where the ALC function is disabled, digital camera 100 proceeds to step S603. When controller 130 proceeds to step S603, controller 130 causes microphone level meter 701 illustrated in FIG. 7A to be displayed over the through image displayed on display unit 190. In step S602, controller 130 checks whether the setting of microphone level meter 701 is "visible" or "hidden". In the case where the setting of microphone level meter 701 is "visible", controller 130 proceeds to step S603 to cause microphone level meter 701 to be displayed over the through image displayed on display unit 190. In the case where the setting of microphone level meter 701 is "hidden", controller 130 proceeds to step S604 not to cause microphone level meter 701 to be displayed over the through image displayed on display unit 190.

Figure 7B:
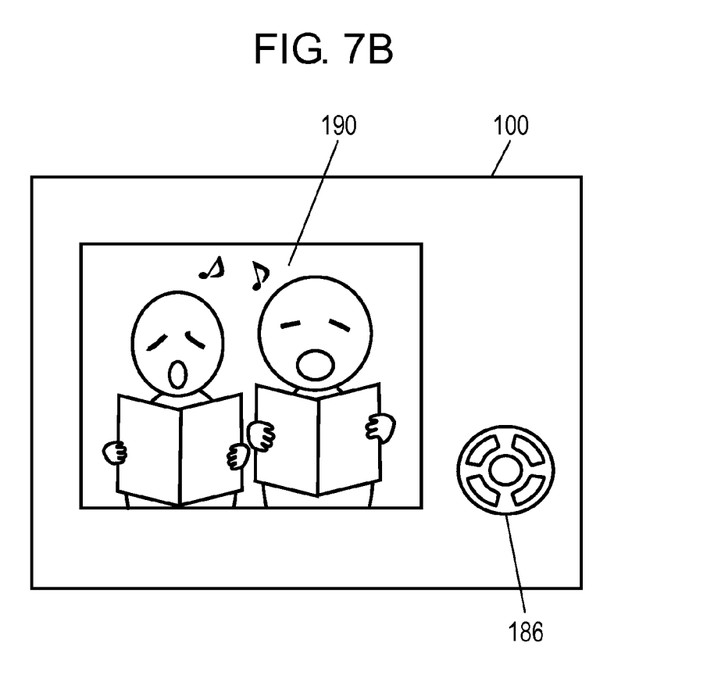
FIG. 7B is a diagram showing an exemplary display on the display unit of the digital camera according to the first exemplary embodiment with the microphone level meter hidden.

FIG. 7A and FIG. 7B are diagrams showing exemplary displays on display unit 190 of digital camera 100. When controller 130 proceeds to step S603 of FIG. 6, controller 130 causes microphone level meter 701 to be displayed over the through image displayed on display unit 190 as illustrated in FIG. 7A. When controller 130 proceeds to step S604 of FIG. 6, controller 130 does not cause microphone level meter 701 to be displayed over the through image displayed on display unit 190 as illustrated in FIG. 7B. In the state of FIG. 7A, the user can confirm the microphone level by microphone level meter 701. Then, the user can set the amplification degree of microphone amplifier 401 to an appropriate value by operating, for example, directional buttons 186 on operation unit 180 as required.

3. Modification

Figure 8:
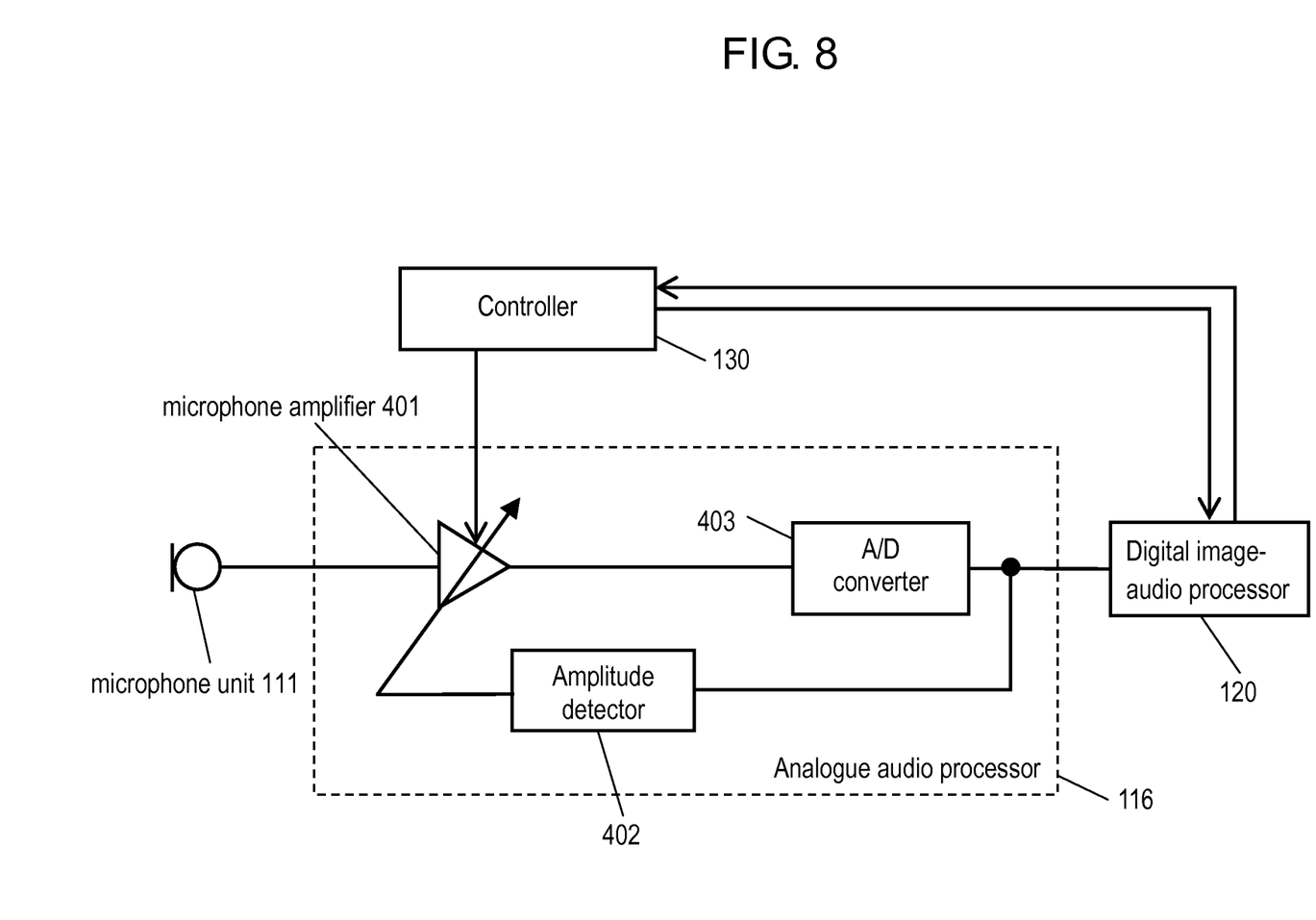
FIG. 8 is a block diagram illustrating a configuration containing an analogue audio processor and peripheral components of the analogue audio processor in a modification.

Hereinafter, a modification will be described. FIG. 8 is a block diagram illustrating a configuration containing analogue audio processor 116 and peripheral components of analogue audio processor 116 according to the modification.

In the above described embodiment, the analog audio signal output from microphone amplifier 401 is input to amplitude detector 402 and feedback control of the amplification degree of microphone amplifier 401 is performed so that the amplitude of the analog audio signal does not exceed the acceptable input level for A/D converter 403. On the other hand, in the modification, a digital audio signal output from A/D converter 403 is input to amplitude detector 402 and feedback control of the amplification degree of microphone amplifier 401 is performed so that the output of the digital audio signal output from A/D converter 403 does not exceed the acceptable level. Also with this configuration, analog audio processor 116 can achieve the ALC function. In that case, an ALC unit is formed with microphone amplifier 401, amplitude detector 402, and A/D converter 403.

4. Operation and Effect

As described above, the recorder according to the first exemplary embodiment forces microphone level meter 701 to be displayed in the case where the ALC function is disabled. If the ALC function was disabled and microphone level meter 701 was hidden, the user would not be aware that the microphone level is too high and would make the mistake of recording distorted sound. With the recorder according to the first exemplary embodiment which forces microphone level meter 701 to be displayed in the case where the ALC function is disabled, the user can be easily aware that the microphone level is too high at the sight of microphone level meter 701. Then, the user can avoid making the mistake of recording distorted sound by operating directional buttons 186 to set an appropriate value to the amplification degree of microphone amplifier 401 as required.

5. Other Exemplary Embodiments

The present disclosure is not limited to the above described first exemplary embodiment and various exemplary embodiments are possible. Other exemplary embodiments of the present disclosure will be collectively described below.

Although directional buttons 186 are used as the operation unit for the user to set the amplification degree of microphone amplifier 401 in the first exemplary embodiment, a dial included in operation unit 180 or display unit 190 including a touch panel may be used as the operation unit.

In the above described first exemplary embodiment, an imaging device including a sound pickup device is described by using digital camera 100 as an example. However, any imaging device can be used as far as it is equipped with a microphone and a display unit, allows the user to enable or disable the ALC function, and is capable of recording sound. That is, a video camera or a voice recorder can be used.

Although digital image-audio processor 120 and controller 130 are described as having the above described functions and configurations respectively in the above described first exemplary embodiment, digital image-audio processor 120 and controller 130 may be configured to have part of their functions and configurations in common with each other.

Although CCD image sensor 143 is described as an example of an imaging unit in the above described first exemplary embodiment, the present disclosure is not limited to that. That is, another imaging element such as a CMOS image sensor or an NMOS image sensor can be also applied to the present disclosure. Although it is described that display unit 190 is a liquid crystal display in the above described first exemplary embodiment, the present disclosure is not limited to that. That is, another display device such as an organic EL (electroluminescent) display device can be also applied to the present disclosure.

The exemplary embodiments have been described above as examples of the technology of the present disclosure. For describing those exemplary embodiments, the accompanying drawings and the detailed description have been provided.

The constituent elements illustrated in the accompanying drawings and discussed in the detailed description may include not only the constituent element necessary to solve the problem but also the constituent element unnecessary to solve the problem in order to exemplify the technology. Therefore, the unnecessary constituent element should not be instantly recognized as a necessary constituent element merely because it is illustrated in the accompanying drawings and described in the detailed description.

Since the above described exemplary embodiments are for exemplifying the technology of the present disclosure, various changes, substitutions, additions, omissions, and the like may be made to the exemplary embodiments without departing from the scope of the claims and the equivalent of the claims.

The present disclosure is applicable to devices with a recording function such as digital cameras and movie cameras.

What is claimed is:

1. A recorder comprising:
    a converter configured to acquire external sound and to convert the sound into a first signal;
    an amplifier configured to amplify the first signal to generate a second signal;
    a recording unit configured to record the second signal;
    a display unit configured to display a level of the second signal; and
    a controller configured to control the amplifier and the display unit,
    wherein
    the amplifier comprises an automatic level control unit configured to adjust an amplification degree for amplifying the first signal according to the level of the second signal, and
    the controller
        allows a choice of whether or not to cause the automatic level control unit to operate,
        allows a choice of whether to display or hide the level of the second signal on the display unit when the automatic level control unit operates, and
        keeps the level of the second signal displayed on the display unit when the automatic level control unit does not operate.

2. The recorder according to claim 1 further comprising an operation unit configured to allow a setup of the amplification degree of the amplifier,
    wherein the controller controls the amplifier by using the amplification degree set by the operation unit.

3. The recorder according to claim 1, wherein
    the automatic level control unit
        increases the amplification degree of the amplifier so that the level of the second signal becomes higher than a predetermined level, when the level of the second signal is lower than the predetermined level, and
        decreases the amplification degree of the amplifier so that the level of the second signal becomes lower than the predetermined level, when the level of the second signal is higher than the predetermined level.

4. The recorder according to claim 1, wherein
    the automatic level control unit
        decreases the amplification degree of the amplifier so that the level of the second signal becomes lower than a predetermined level, when the level of the second signal is higher than the predetermined level, and
        keeps the amplification degree of the amplifier to a predetermined value, when the level of the second signal becomes lower than the predetermined level.

5. The recorder according to claim 1, wherein the amplifier comprises a processor configured to process the second signal.

* * * * *